(12) United States Patent
Zheng et al.

(10) Patent No.: US 8,784,975 B2
(45) Date of Patent: Jul. 22, 2014

(54) SELF-ALIGNED WAFER BONDING

(71) Applicant: Seagate Technology LLC, Cupertino, CA (US)

(72) Inventors: Jun Zheng, Edina, MN (US); Dadi Setiadi, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/913,817

(22) Filed: Jun. 10, 2013

(65) Prior Publication Data
US 2013/0273328 A1    Oct. 17, 2013

Related U.S. Application Data

(62) Division of application No. 12/500,892, filed on Jul. 10, 2009, now Pat. No. 8,460,794.

(51) Int. Cl.
*B32B 3/02*    (2006.01)

(52) U.S. Cl.
USPC .................. 428/195.1; 428/201; 428/209

(58) Field of Classification Search
USPC ........................ 428/195.1, 201, 209
See application file for complete search history.

(56) References Cited

U.S. PATENT DOCUMENTS

| 5,236,118 A | 8/1993 | Bower |
| 5,355,577 A | 10/1994 | Cohn |
| 6,406,636 B1 | 6/2002 | Vaganov |
| 6,667,225 B2 | 12/2003 | Hau-Riege |
| 2010/0248424 A1 | 9/2010 | Luce |

OTHER PUBLICATIONS

Sato et al., Self-Alignment of Microparts Using Liquid Surface Tension . . . , Precision Engineering 27 (2003) 42-50.
Syms et al., Surface Tension-Powered Self-Assembly of Microstructures . . . , Journal of Microelectromechanical Systems, vol. 12, No. 4, Aug. 2003.

*Primary Examiner* — Elizabeth Mulvaney
(74) *Attorney, Agent, or Firm* — Mueting, Raasch & Gebhardt PA

(57) ABSTRACT

A wafer article includes a substrate, two or more hydrophilic areas disposed on the substrate, hydrophobic areas surrounding the hydrophilic areas, and a eutectic bonding material disposed on the substrate. A wafer apparatus including two wafers having complimentary hydrophilic regions and eutectic bonding material is disclosed and a method of forming a bonded wafer articles is disclosed.

14 Claims, 5 Drawing Sheets

SELF-ALIGNED WAFER BONDING

CROSS-REFERENCE

This application is a divisional of application Ser. No. 12/500,892, filed Jul. 10, 2009, the contents of each is hereby incorporated by reference in its entirety.

BACKGROUND

Wafer to wafer, chip to wafer, or ship to chip (all used interchangeable herein) bonding can require high precision alignment and high precision bonding. Conventional precision alignment and bonding of wafers has consisted of visual alignment utilizing microscopes.

Visual alignment can be useful when one of the wafers is transparent. However, when both of the wafers are opaque, high precision alignment is difficult. Conventional alignment techniques can have an alignment precision in a range from 5 to 10 micrometers.

As features scale down on the wafers, high precision alignment becomes more difficult. There is a need for high precision wafer bonding technique that can align wafer features to within 100 nanometers or less.

BRIEF SUMMARY

The present disclosure relates to self-aligned wafer bonding. In particular, the present disclosure relates to a self-alignment technique utilizing liquid surface tension to align complimentary hydrophilic areas of two wafers to be bonded together. Once aligned the liquid is evaporated and the wafers are bonded with a low temperature eutectic metal alloy.

In an embodiment, a wafer article includes a substrate, two or more hydrophilic areas disposed on the substrate, hydrophobic areas surrounding the hydrophilic areas, and a eutectic bonding material disposed on the substrate.

A method of wafer bonding includes apply water droplets to first hydrophilic areas disposed on a first wafer, first hydrophobic areas surround the first hydrophilic areas, a first metal alloy eutectic bonding material is disposed on the first wafer and aligning a second wafer second hydrophilic areas with the first hydrophilic areas, a second metal alloy eutectic bonding material is disposed on the second wafer. Then the method includes contacting the second hydrophilic areas to the water droplets, the water droplets separating the second hydrophilic areas from the first hydrophilic areas.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to self-aligned wafer bonding. In particular, the present disclosure relates to a self-alignment technique utilizing liquid surface tension to align complimentary hydrophilic areas of two wafers to be bonded together. Once aligned the liquid is evaporated and the wafers are bonded with a low temperature eutectic metal alloy. While the present disclosure is not so limited, an appreciation of various aspects of the disclosure will be gained through a discussion of the examples provided below.

Figure 1:
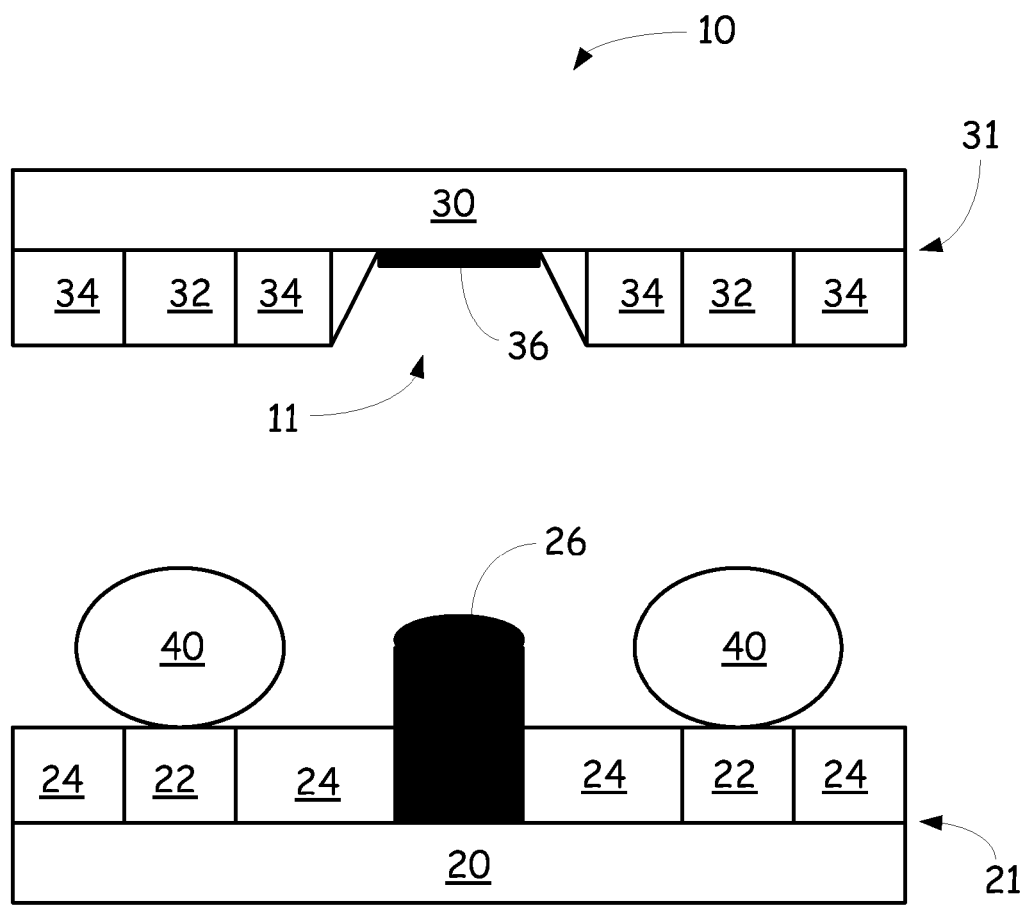
FIG. 1 is a cross-sectional schematic diagram of an illustrative wafer apparatus where a first wafer is initially aligned with a second wafer.

FIG. 1 is a cross-sectional schematic diagram of an illustrative wafer apparatus 10 where a first wafer 21 is initially aligned with a second wafer 31. The first wafer 21 includes a substrate 20, two or more hydrophilic areas 22 disposed on the substrate 20, hydrophobic areas 24 surrounding the hydrophilic areas 22, and a eutectic bonding material 26 disposed on the substrate 20. The second wafer 31 includes a substrate 30, two or more hydrophilic areas 32 disposed on the substrate 30, hydrophobic areas 34 surrounding the hydrophilic areas 32, and a eutectic bonding material 36 disposed on the substrate 30. The first two or more hydrophilic areas 22 are in course registration with the second two or more hydrophilic areas 32.

The substrate 20, 30 can be any useful material. In many embodiments the substrate is formed from a semiconductor material or glass material. In many embodiments the substrate is formed from an opaque material. The hydrophilic areas 22, 32 can be formed of any hydrophilic material that is easily wettable (e.g., a high wettability area). The hydrophobic areas 24, 34 can be formed of any hydrophobic material that is not easily wettable (e.g., a low wettability area). The hydrophilic areas 22, 32 and the hydrophobic areas 24, 34 can be deposited onto the substrate utilizing conventional semiconductor fabrication techniques.

In many embodiments the eutectic bonding material 26, 36 is a metal alloy having a reduced melting point. The eutectic bonding material 26, 36 can have a melting point from 250 degrees centigrade to 400 degrees centigrade, for example. Illustrative eutectic bonding material 26, 36 includes copper/tin alloy (250 degrees centigrade), gold/tin (300 degrees centigrade), and silicon/gold (400 degrees centigrade). FIG. 1 illustrates the eutectic bonding material 26 extending away from the first wafer 21 or substrate 20 as a pillar or post and the eutectic bonding material 36 disposed within a recess 11 of the second wafer 31 as a layer.

Water droplets 40 are disposed on the first or second wafer 21, 31 and coalesce on the hydrophilic areas 22, 32 to form water droplets 40. The hydrophobic areas 24, 34 assist in maintaining the integrity of the water droplets 40. The water droplets 40 can have any size. In many some embodiments the water droplets 40 have a size in a range from 0.5 to 1.5 millimeters.

Figure 2:
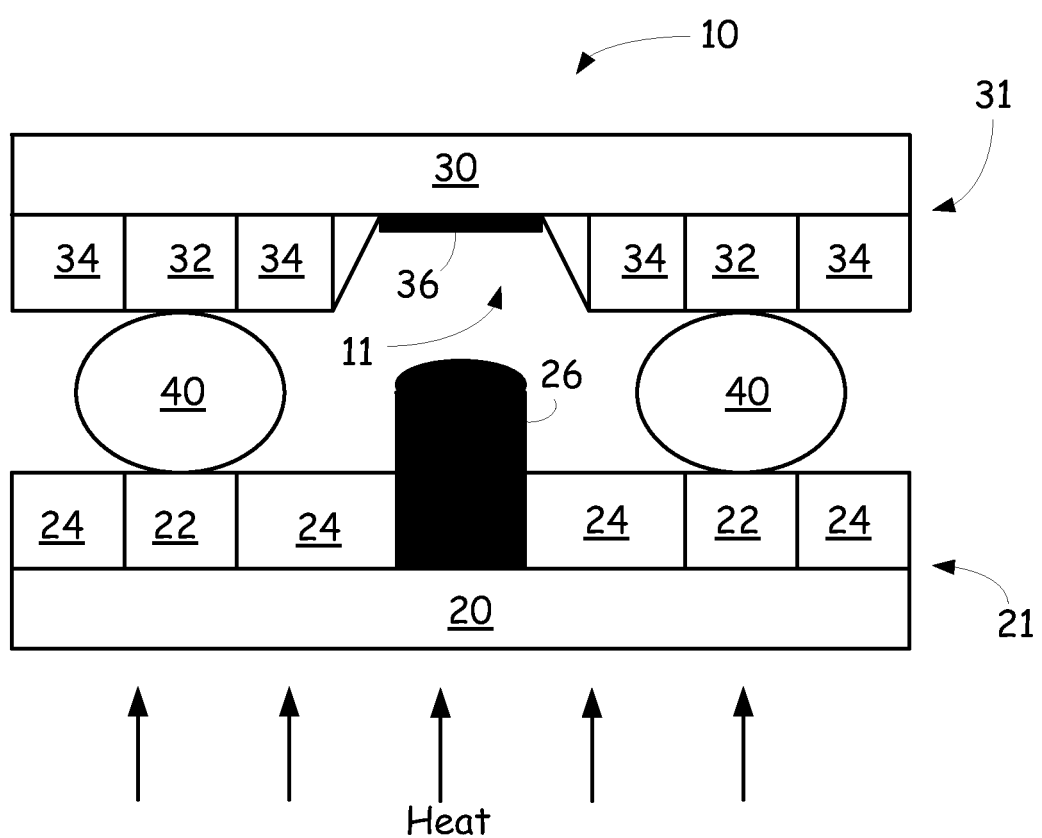
FIG. 2 is a cross-sectional schematic diagram of an illustrative wafer apparatus where a first wafer and second wafer are separated by water droplets.

FIG. 2 is a cross-sectional schematic diagram of an illustrative wafer apparatus 10 where a first wafer 21 and second wafer 31 are separated by water droplets 40. The first wafer 21 and the second wafer 31 can be moved toward each other until the water droplets 40 contact complementary hydrophilic areas 22, 32. The hydrophobic areas 24, 34 assist in maintaining the integrity of the water droplets 40. Surface tension of the water droplets 40 will precisely align the complementary hydrophilic areas 22, 32 to within 100 nanometers or less. Thus, the first wafer 21 and second wafer 31 are self-aligned via liquid surface tension of the water droplets 40 contacting the complementary hydrophilic areas 22, 32.

In many embodiments, the eutectic bonding material 26, 36 approach each other but do not contact. In some embodiments the eutectic bonding material 26 extending away from the first wafer 21 or substrate 20 as a pillar or post can enter the recess 11 of the second wafer 31 but not contact the bonding material 36 disposed on the second substrate 30.

Once the first wafer 21 and second wafer 31 are self-aligned via liquid surface tension of the water droplets 40 contacting the complementary hydrophilic areas 22, 32, heat is applied to the water droplets 40 to vaporize the water droplets 40. In many embodiments heat is applied through the first wafer 21 to vaporize the water droplets 40. As the water droplet 40 vaporizes, the first wafer 21 and second wafer 31 move toward each other until the first wafer 21 and second wafer 31 touch each other. During this process, the eutectic bonding material 26, 36 comes into contact with each other, as shown in FIG. 3.

Figure 3:
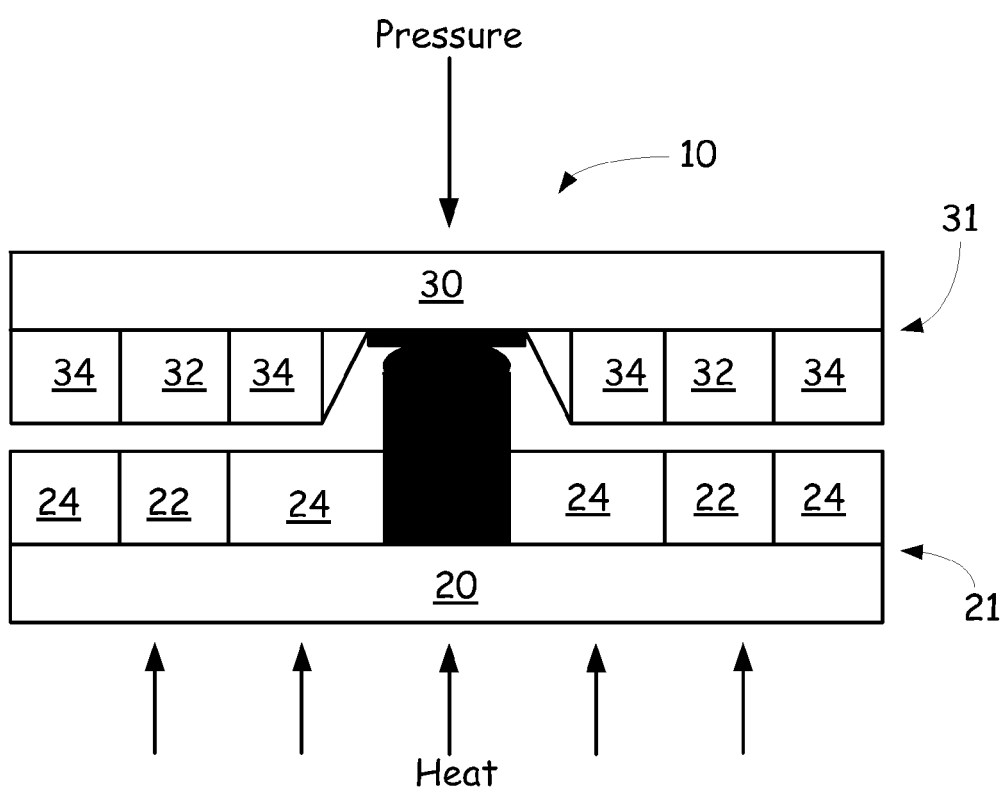
FIG. 3 is a cross-sectional schematic diagram of an illustrative wafer apparatus where a first wafer and second wafer are aligned and bonding metal on each wafer contacts each other.

FIG. 3 is a cross-sectional schematic diagram of an illustrative wafer apparatus 10 where a first wafer 21 and second wafer 31 are aligned and bonding metal on each wafer contacts each other. The substrates 20, 30, complementary hydrophilic areas 22, 32, and hydrophobic areas 24, 34 are described above. Once the eutectic bonding material comes into contact with each other, heat and pressure is applied to the first wafer 21 and second wafer 31 to form a eutectic bond with the eutectic bonding material. As described above, the eutectic bonding material can be heated to a temperature from, for example, 250 to 400 degrees centigrade and a pressure of $1.6 \times 10^4$ to $3.2 \times 10^5$ Pascals, depending on the eutectic bonding material utilized.

Figure 4:
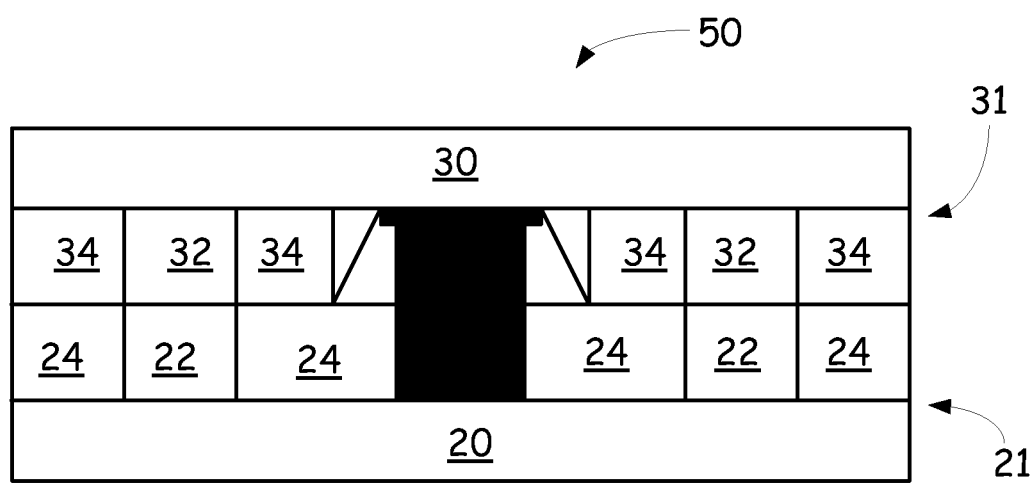
FIG. 4 is a cross-sectional schematic diagram of an illustrative bonded wafer.

FIG. 4 is a cross-sectional schematic diagram of an illustrative bonded wafer 50. The bonded wafer includes a first wafer 21 and second wafer 31 aligned to within 100 nanometers or less and bonded by bonding metal, described above. The substrates 20, 30, complementary hydrophilic areas 22, 32, and hydrophobic areas 24, 34 are described above. In many embodiments the complementary hydrophilic areas 22, 32 to within 100 nanometers or less.

Figure 5:
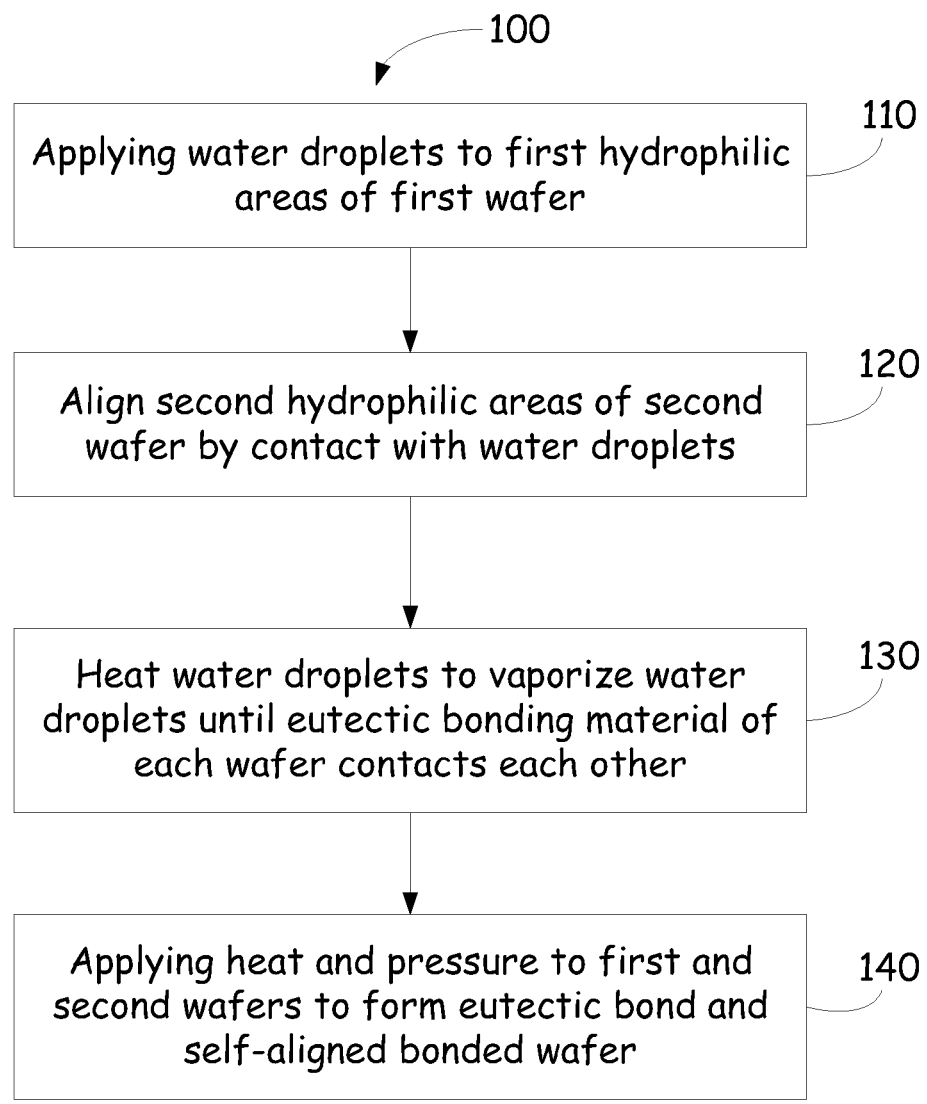
FIG. 5 is a schematic flow diagram of an illustrative method of self-aligned wafer bonding.

FIG. 5 is a schematic flow diagram 100 of an illustrative method of self-aligned wafer bonding. The method includes applying water droplets to first hydrophilic areas disposed on a first wafer at block 110. A second wafer with second hydrophilic areas is aligned with the first hydrophilic areas and water droplets contact the second hydrophilic areas and the first hydrophilic areas at block 120. The water droplets separate the second hydrophilic areas from the first hydrophilic areas. Liquid surface tension of the water droplets align the second hydrophilic areas with the first hydrophilic areas.

Once aligned, the water droplets are heated to evaporate the water droplets and contact the first metal alloy eutectic bonding material with the second metal alloy eutectic bonding material at block 130. Then, heat and pressure can be applied to the first metal alloy eutectic bonding material and the second metal alloy eutectic bonding material to melt and bond the first metal alloy eutectic bonding material and the second metal alloy eutectic bonding material at block 140.

Thus, embodiments of the SELF-ALIGNED WAFER BONDING are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A wafer apparatus comprising:
   a first wafer comprising a first substrate and two or more first hydrophilic areas disposed on the first substrate, first hydrophobic areas surrounding the first hydrophilic areas, and a first eutectic bonding material disposed on the first substrate;
   a second wafer comprising a second substrate and two or more second hydrophilic areas disposed on the second substrate, second hydrophobic areas surrounding the second hydrophilic areas, and a second eutectic bonding material disposed on the second substrate and bonded with the first eutectic bonding material, the first hydrophilic areas aligned with and facing the second hydrophilic areas.

2. A wafer apparatus according to claim 1, further comprising a water droplet disposed on at least selected first hydrophilic areas.

3. A wafer apparatus according to claim 2, wherein the water droplet contacts complimentary selected second hydrophilic areas and aligns the first hydrophilic areas with the second hydrophilic areas.

4. A wafer apparatus according to claim 3, wherein the water droplet aligns the first hydrophilic areas with the second hydrophilic areas to within 100 nm or less.

5. A wafer apparatus according to claim 1, wherein the first eutectic bonding material extends away from the first wafer and the second eutectic bonding material in disposed within a recess of the second wafer.

6. A wafer apparatus according to claim 5, wherein the first eutectic bonding material extends into the recess of the second wafer.

7. A wafer apparatus according to claim 1, wherein the eutectic bonding material is a metal alloy eutectic bonding material.

8. A wafer apparatus comprising:
- a first wafer comprising a first substrate and two or more first hydrophilic areas disposed on the first substrate, first hydrophobic areas surrounding the first hydrophilic areas, and a first eutectic bonding material disposed on the first substrate;
- a second wafer comprising a second substrate and two or more second hydrophilic areas disposed on the second substrate, second hydrophobic areas surrounding the second hydrophilic areas, and a second eutectic bonding material disposed on the second substrate, the first hydrophilic areas aligned with and facing the second hydrophilic areas.

9. A wafer apparatus according to claim 8, further comprising a water droplet disposed on at least selected first hydrophilic areas.

10. A wafer apparatus according to claim 9, wherein the water droplet contacts complimentary selected second hydrophilic areas and aligns the first hydrophilic areas with the second hydrophilic areas.

11. A wafer apparatus according to claim 10, wherein the water droplet aligns the first hydrophilic areas with the second hydrophilic areas to within 100 nm or less.

12. A wafer apparatus according to claim 8, wherein the first eutectic bonding material extends away from the first wafer and the second eutectic bonding material in disposed within a recess of the second wafer.

13. A wafer apparatus according to claim 12, wherein the first eutectic bonding material extends into the recess of the second wafer.

14. A wafer apparatus according to claim 8, wherein the eutectic bonding material is a metal alloy eutectic bonding material.

* * * * *